United States Patent
Keehn et al.

(10) Patent No.: US 10,204,659 B1
(45) Date of Patent: Feb. 12, 2019

(54) HARD DISK DRIVE BACKPLANE FOR IMMERSION-COOLED CIRCUIT BOARD

(71) Applicant: Microsoft Technology Licensing, LLC, Redmond, WA (US)

(72) Inventors: Nicholas Andrew Keehn, Kirkland, WA (US); Michael Rees Helsel, Seattle, WA (US); David Thomas Gauthier, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/953,412

(22) Filed: Apr. 14, 2018

(51) Int. Cl.
| | | |
|---|---|---|
| *G11B 33/12* | (2006.01) | |
| *H05K 1/02* | (2006.01) | |
| *H05K 1/18* | (2006.01) | |
| *H05K 7/20* | (2006.01) | |
| *G11B 33/14* | (2006.01) | |

(52) U.S. Cl.
CPC .......... *G11B 33/122* (2013.01); *G11B 33/142* (2013.01); *H05K 1/0203* (2013.01); *H05K 1/181* (2013.01); *H05K 7/20236* (2013.01); *H05K 7/20272* (2013.01); *H05K 2201/064* (2013.01); *H05K 2201/10159* (2013.01); *H05K 2201/10522* (2013.01)

(58) Field of Classification Search
USPC ..... 361/699, 702, 694, 695, 679.49, 679.51; 165/104.33; 454/184; 312/236
See application file for complete search history.

(56) References Cited

U.S. PATENT DOCUMENTS

| | | | | |
|---|---|---|---|---|
| 7,397,662 | B2* | 7/2008 | Oyamada | H05K 7/20572 165/80.4 |
| 7,639,499 | B1* | 12/2009 | Campbell | H05K 7/20772 165/104.19 |
| 7,911,793 | B2* | 3/2011 | Attlesey | G06F 1/20 165/104.33 |
| 7,961,475 | B2* | 6/2011 | Campbell | H05K 7/20772 165/80.4 |
| 8,274,787 | B2* | 9/2012 | Alyaser | F28D 15/00 361/679.52 |
| 8,780,556 | B1* | 7/2014 | Ditri | H05K 7/1404 165/80.2 |
| 2013/0081258 | A1* | 4/2013 | Campbell | H05K 13/00 29/592.1 |
| 2013/0208421 | A1* | 8/2013 | Chester | H05K 7/20772 361/699 |

(Continued)

*Primary Examiner* — Lisa Lea Edmonds
(74) *Attorney, Agent, or Firm* — Buckley, Maschoff & Talwalkar LLC

(57) ABSTRACT

A system includes a support member and a hard disk drive interface connector, where a first side of the hard disk drive interface connector is disposed on a first side of the support member and a second side of the hard disk drive interface connector disposed on a second side of the support member. A conduit is coupled to the support member and to a fluid inlet disposed on the first side of the support member. A fluid outlet is disposed on the first side of the support member, and a housing is coupled to the first side of the support member and defines a volume with the support member, where an interface between the housing and the first side of the support member is leak-resistant, and where the fluid inlet and fluid outlet are in fluid communication with the volume.

20 Claims, 11 Drawing Sheets

(56) References Cited

U.S. PATENT DOCUMENTS

| | | | | |
|---|---|---|---|---|
| 2015/0062806 A1* | 3/2015 | Shelnutt | ................ | H05K 7/203 |
| | | | | 361/679.53 |
| 2015/0077930 A1* | 3/2015 | Kadotani | ........... | H05K 7/20781 |
| | | | | 361/679.53 |
| 2016/0183409 A1* | 6/2016 | Zhou | .................. | H05K 7/20281 |
| | | | | 361/699 |
| 2017/0303431 A1* | 10/2017 | Kim | .................. | H05K 7/20254 |

* cited by examiner

HARD DISK DRIVE BACKPLANE FOR IMMERSION-COOLED CIRCUIT BOARD

BACKGROUND

The electrical components of modern computing systems generate significant amounts of heat. Overheating of the components may compromise their performance and/or cause damage thereto. Computing systems therefore typically employ systems for cooling their constituent electrical components.

Cooling systems include and are not limited to fans, heat sinks, and recirculated coolant. Recirculated coolant may be enclosed in a structure which is placed in contact with electrical component to be cooled. Some conventional systems immerse the component within the coolant. For example, a chassis may be sealed and filled with recirculating coolant fluid to cool the components therein, or one or more motherboards may be immersed in a vertically-standing container of coolant.

Immersion-based cooling is suitable for cooling electrical components which are substantially impervious to the utilized coolant. These components include most integrated circuits, discrete components (i.e., capacitors, resistors, etc.) and solid-state hard drives. A conventional hard disk drive, in contrast, regulates internal pressure using a hole which exposes the inside of the drive to ambient air. Such a drive is not compatible with immersion-based cooling because coolant may enter through the hole (or other opening) and thereby render the drive unusable.

Integrated computer servers (including, e.g., a circuit board, memory and data storage) are designed in view of a desired balance of cost and performance. Some server designs favor the cost/performance profile of disk-based drives as compared to solid-state drives. However, disk-based drives are not usable with these server configurations if the servers are to be immersion-cooled. Such immersion-cooled servers require solid-state drives, which are typically more costly than solid-state drives. Systems are desired which facilitate immersion cooling of hard disk drive-based servers.

DETAILED DESCRIPTION

The following description is provided to enable any person in the art to make and use the described embodiments. Various modifications, however, will remain readily-apparent to those in the art.

Generally, some embodiments provide immersive cooling of circuit board components (e.g., components of a server motherboard) which are configured to utilize non-submersible hard disk drives. Some embodiments allow standard hard disk drive-based server designs to be adapted to a vertically-stored immersive-cooled implementation without being redesigned to accommodate immersible solid state drives.

As will be described below, some embodiments utilize a support member including a first side on which the circuit board components may be mounted, and a second side on which one or more hard disk drives may be mounted. A housing is coupled to the first side to define a leak-resistant volume surrounding the circuit board components. Coolant fluid may be circulated through the volume to cool the components without exposing the hard disk drives to the coolant fluid.

A first side of a hard disk drive interface connector may be disposed on the first side of the support member for connection to the circuit board components, with a second side of the hard disk drive interface connector disposed on the second side of the support member for connection to one or more hard disk drives. The hard disk drive interface connector may pass through an opening in the support member which is sealed to prevent coolant fluid from passing therethrough.

A conduit may be coupled to the support member and to a fluid inlet which is disposed on the first side of the support member and within the leak-resistant volume. Coolant fluid may be introduced to the volume via the conduit and fluid inlet. The volume may also include a fluid outlet disposed on the first side of the support member and within the volume. The fluid outlet may provide an exit path for the coolant fluid during operation.

Figure 1:
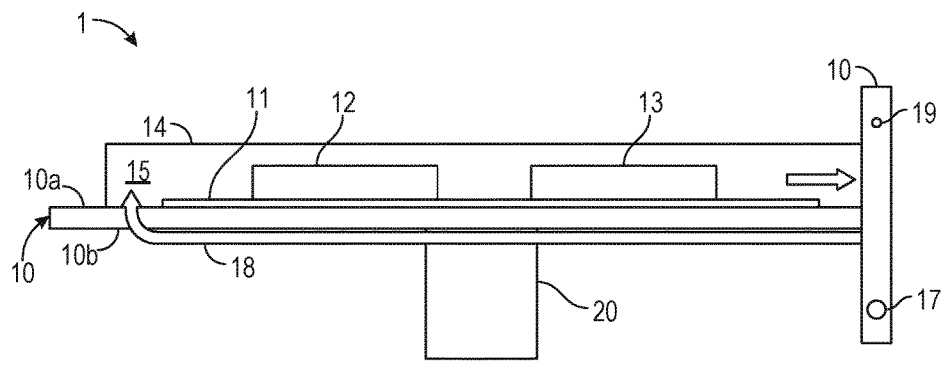
FIG. 1 is a side elevational view of an apparatus according to some embodiments.
Figure 2:
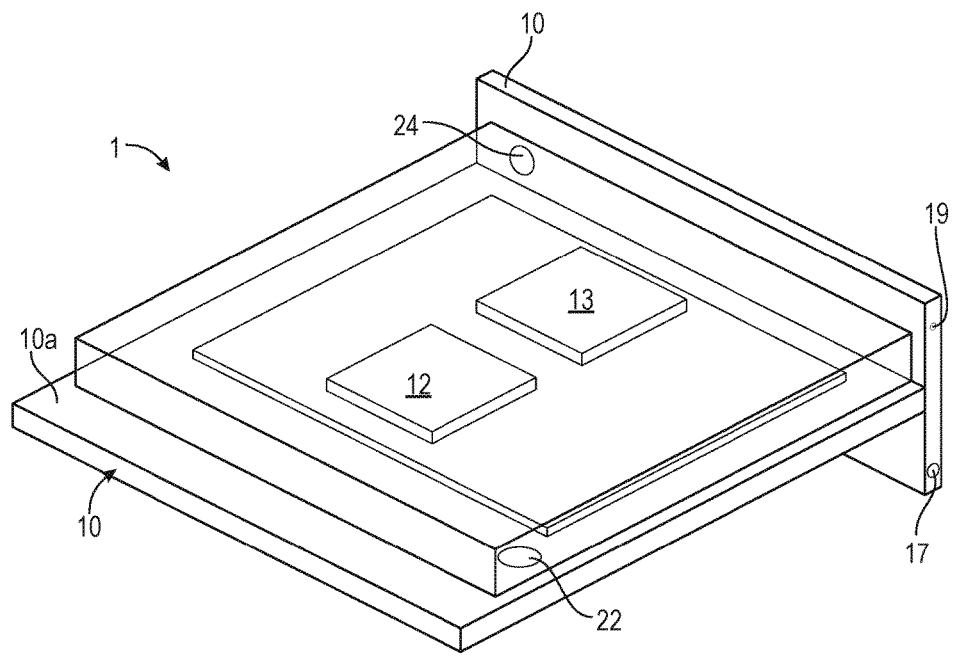
FIG. 2 is a perspective view of a first side of the FIG. 1 apparatus according to some embodiments.
Figure 3:
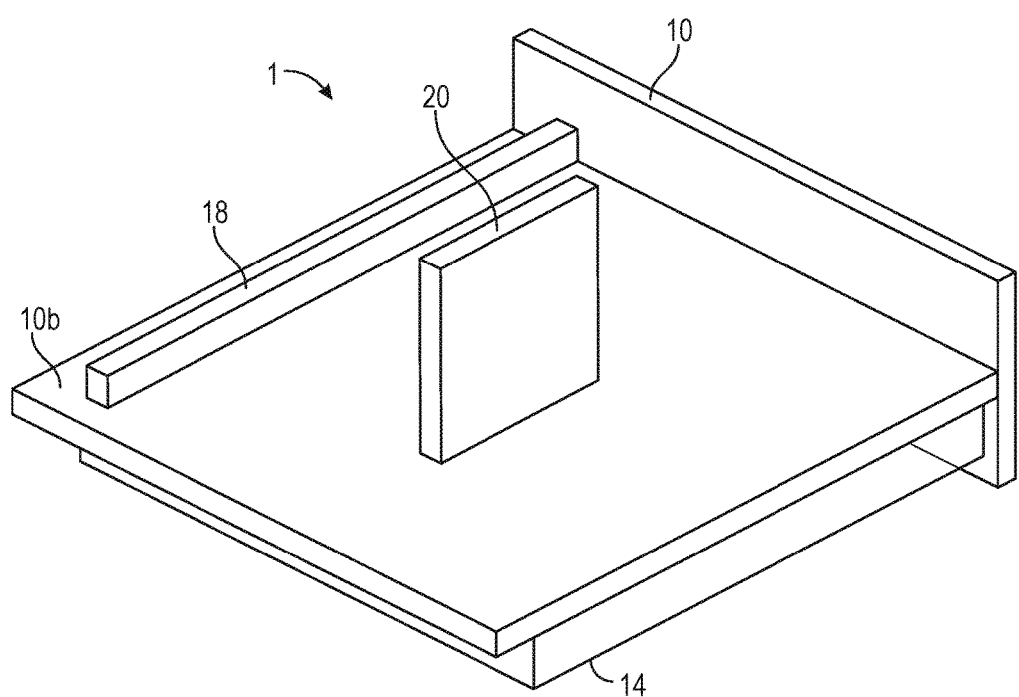
FIG. 3 is a perspective view of a second side of the FIG. 1 apparatus according to some embodiments.

FIGS. 1-3 illustrate apparatus 1 according to some embodiments. Apparatus 1 includes support member 10 including first side 10a and second side 10b. Support member 10 may comprise aluminum, steel, any number of plastics, and any combination thereof. Support member 10 may comprise any suitably-sturdy material or combination of materials. In some embodiments, first side 10a is chemically inert with respect to the coolant fluid described below.

Substrate 11 may include a printed circuit board (PCB) or a semiconductor package. Substrate 11 may comprise any type of circuit board or any other type of substrate for supporting any heat-generating devices. Substrate 11 is mounted to first side 10a using any suitable mounting system. Standard mounting points could be used to accommodate multiple circuit board form factors.

Components 12 and 13 may comprise any heat-generating components for which cooling is desired, including but not limited to integrated circuits and discrete components, such as capacitors, resistors, inductors, or the like, and heat sinks. In some examples, components 12 and 13 are encapsulated. Components 12 and 13 are coupled to substrate 11 so as to receive power from and/or exchange data with external devices via substrate 11. According to some embodiments, components 12 and 13 are mounted directly to support member 10.

Housing 14 is coupled to first side 10a to define leak-resistant volume 15 surrounding components 12 and 13. Housing 14 is fluid-impermeable, and may comprise any flexible, semi-rigid, and/or rigid materials or materials suitable for its intended purpose, including but not limited to plastics, elastomeric layers, impermeable polymer films, graphene, elastomer/graphite nanocomposites, resins, metalized plastic, multilayer graphite films, or other materials. In some embodiments, housing 14 comprises single-layer rigid plastic such as blow-molded polypropylene. Housing 14 may insert into grooves or other mating features of support member 10 and be affixed thereto with a mechanical press-fit connection and/or using a leak-resistant sealant such as a mechanical gasket or a silicone-based adhesive. Leak-resistant in the present context refers to substantially leak-proof at normal operating pressures and temperatures.

According to the illustrated embodiment, support member 10 includes a first portion upon which board 11 is mounted, and a second portion substantially perpendicular to the first portion. The second portion may also include features, such as a groove, facilitating a leak-resistant seal between housing 14 and the second portion of support member 10.

Conduit 18 is coupled to second side 10b of member 10 according to the illustrated embodiment. Conduit 18 may comprise a plastic tube coupled to support member 10 using any suitable arrangement. Conduit 18 is coupled to fluid inlet 22 on first side 10a of member 10. Fluid inlet 22 is located within volume 15. Conduit 18 is also in fluid communication with inlet 17 of the second portion of member 10. Accordingly, coolant fluid introduced into inlet 17 passes through the second portion, into conduit 18, through fluid inlet 22 and into volume 15.

The second portion of member 10 defines fluid outlet 24 according to the illustrated embodiment. Fluid outlet 24 is disposed within volume 15 and may operate to evacuate coolant fluid from volume 15 to outlet 19. The flow direction of coolant fluid may be reversed in some embodiments.

In operation, the coolant fluid is in thermal communication with components 12 and 13. Heat from components 12 and 13 is transferred to the coolant fluid, which increases the temperature of the coolant fluid. A pressure differential can be created based upon the introduction of the coolant fluid into volume 15 at a desired inlet flowrate and evacuating fluid at a desired outlet flowrate. In some examples, a pump, multiple pumps, and/or mass flow controllers can be used to control the desired inlet flowrate and the desired outlet flowrate. The coolant fluid absorbs heat generated by components 12 and 13 to maintain components 12 and 13 at a desired operating temperature.

Coolant fluid may comprise a liquid, a liquid mixture, a gas, a gas mixture, or a mixture of liquids and gases. In some examples, the coolant fluid includes a dielectric fluid, such as mineral oil, castor oil, silicon oil, or the like. The coolant fluid absorbs heat generated by heat-generating devices or heat sinks. In various embodiments, the coolant fluid may fully or partially vaporize into a gas in response to absorption of the heat generated by the heat-generating devices.

A first side of a hard disk drive interface connector may be disposed on first side 10a of support member 10. The first side of the hard disk drive interface connector may connect to substrate 11 and/or directly to one or more components mounted thereon. According to some embodiments, the hard disk drive interface connector is a Serial AT Attachment (SATA) interface connector, a Serial Attached Small Computer System Interface (SAS) connector, or other hard disk drive interface connector.

A second side of the hard disk drive interface connector is disposed on second side 10b of support member 10. The second side of the hard disk drive interface connector may be used for connection to one or more hard disk drives such as hard disk drive 20.

The hard disk drive interface connector may pass through an opening in support member 10 which is sealed to prevent coolant fluid within volume 15 from passing through the opening. Accordingly, components within volume 15 may be immersion-cooled while hard disk drive 20 remains dry. In some embodiments, the seal is a flat silicone seal having a rectangular-styled push-through connector which screws into support 10 in order to establish a fluid-tight seal.

Hard disk drive 20 may be cooled, if needed, using fans and fins as are known in the art. According to some embodiments, support 10 may comprise a cold plate exposed to cooled circulated air in order to cool both hard disk drive 20 and, to a lesser degree, coolant fluid within volume 15.

Embodiments may include any number of connectors passing through support 10. For example, some embodiments include an array of SATA connectors, each of which includes a first side disposed on first side 10a for connection to immersion-cooled components, and a second side for connection to one or more hard disk drives. Embodiments may include any number of hard disk drives in any orientation. In this regard, more than one hard disk drive may connect to a single connector using various cabling and/or hard disk drive mounting members as are known in the art. According to some embodiments, one or more hard drive interface connectors passing through support 10 may be connected to solid-state hard drives.

Figure 4:
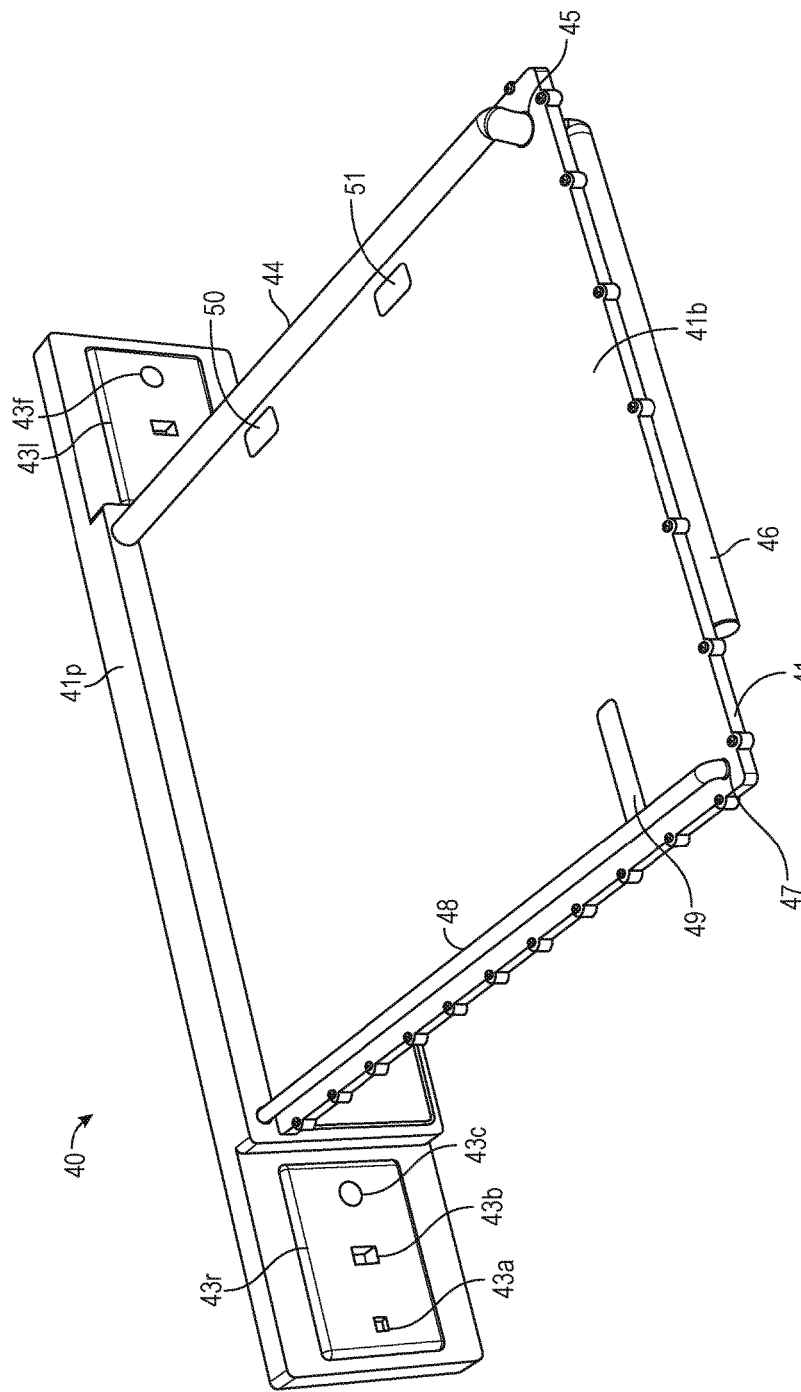
FIG. 4 is a perspective view of a drive-mounting side of an apparatus according to some embodiments.

FIG. 4 illustrates apparatus 40 including support 41 according to some embodiments. Side 41b of support 41 is configured to support one or more hard disk drives. One side of each of connectors 49, 50 and 51 is disposed on side 41b for connection to such hard disk drives.

Inlet conduit 44 is mounted to side 41b and passes through aperture 45. Aperture 45 may comprise a sealed leak-resistant opening through support 41. As shown, inlet conduit 44 is in fluid communication with inlet conduit 46 mounted on an opposite side of support 41. Side 41b also supports outlet conduit 48, which is in fluid communication with sealed and leak-resistant aperture 47.

Inlet conduit 44 and outlet conduit 48 are coupled to portion 41p of support 41. According to some embodiments, coolant fluid passes through portion 41p and inlet conduit 44, and then through outlet conduit 48 and into portion 41p. Portion 41p includes connection blocks 43r and 43l to facilitate this operation. For example, in some embodiments, coolant fluid received from outlet conduit 48 passes through portion 41p and through aperture 43c to a cooling system. Similarly, coolant fluid may be received from a cooling system into aperture 43f, from which it passes through portion 41p and into inlet conduit 44.

In some embodiments, aperture 43a provides external power and signal connections to apparatus 40 and aperture 43b provides a physical connection to a system providing the corresponding power, signal and coolant fluid connections. One such system will be described below with respect to FIG. 9. Embodiments are not limited to the arrangement of connectors 49, 50 and 51 or of conduits 44, 46 and 48, or to external connectivity as described above with respect to connection blocks 43r and 43l.

Figure 5:
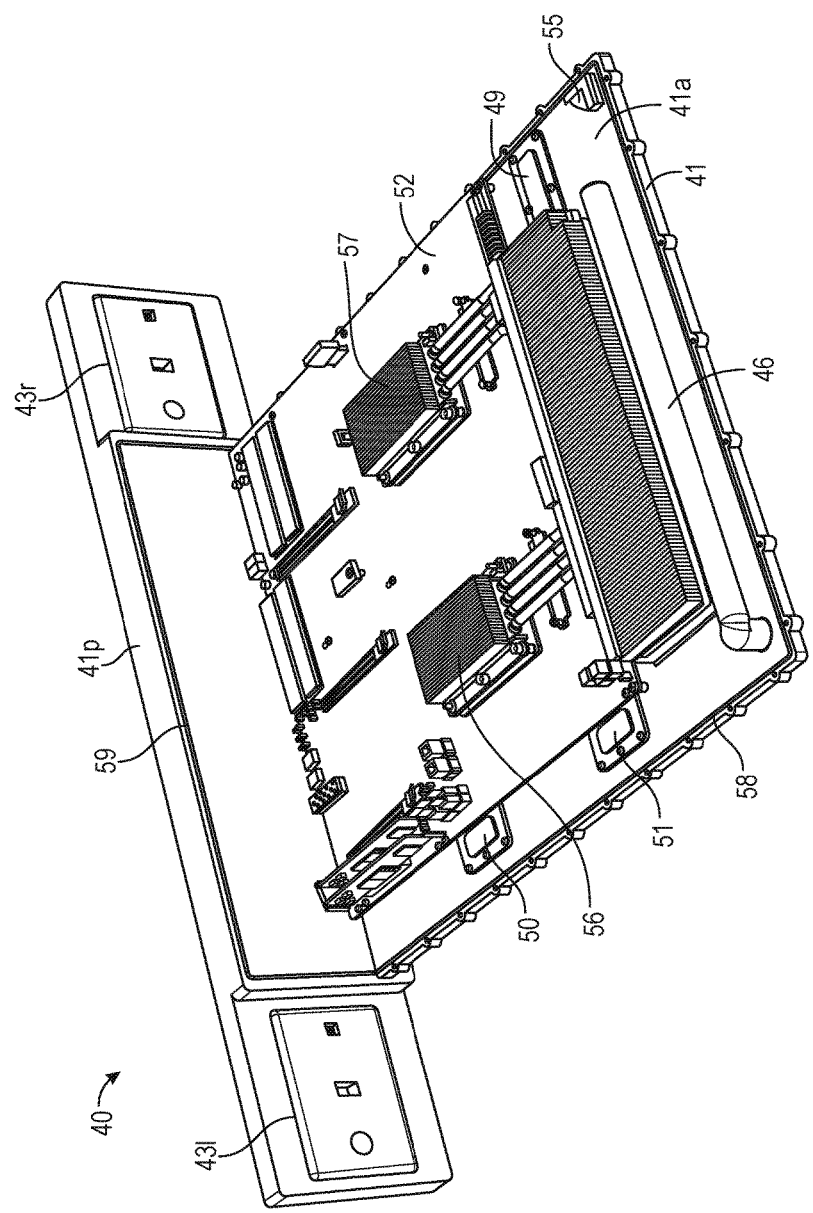
FIG. 5 is a perspective view of an immersible portion of an apparatus according to some embodiments.

FIG. 5 is a view of apparatus 40 from a different perspective than depicted in FIG. 4. FIG. 5 shows side 41a of support 41 and the elements mounted thereon. More specifically, circuit board 52 and conduit 46 are mounted to side 41a, and connectors 49, 50 and 51 are mounted to and pass through side 41a as described above. According to the illustrated embodiment, heat-generating electrical components 56 and 57 are physically and electrically mounted to circuit board 52. Other components are also mounted to circuit board 52. These other components may be less prone to overheating than components 56 and 57 but would nonetheless be cooled during operation as described herein.

Groove 58 runs along a perimeter of support 41, and may be contiguous with groove 59 defined by portion 41p. As described above, a housing may physically mate with grooves 58 and 59 to provide, in conjunction with an adhesive sealant, a leak-resistant volume surrounding substrate 52 and the components mounted thereon. Embodiments may employ any suitable system to mount such a housing to support 41.

According to the illustrated embodiment, conduit 46 is a fluid inlet for introducing coolant fluid into the volume. The coolant fluid may evacuate via fluid outlet 55, which is in fluid communication with outlet conduit 48 of FIG. 4.

Figure 6:
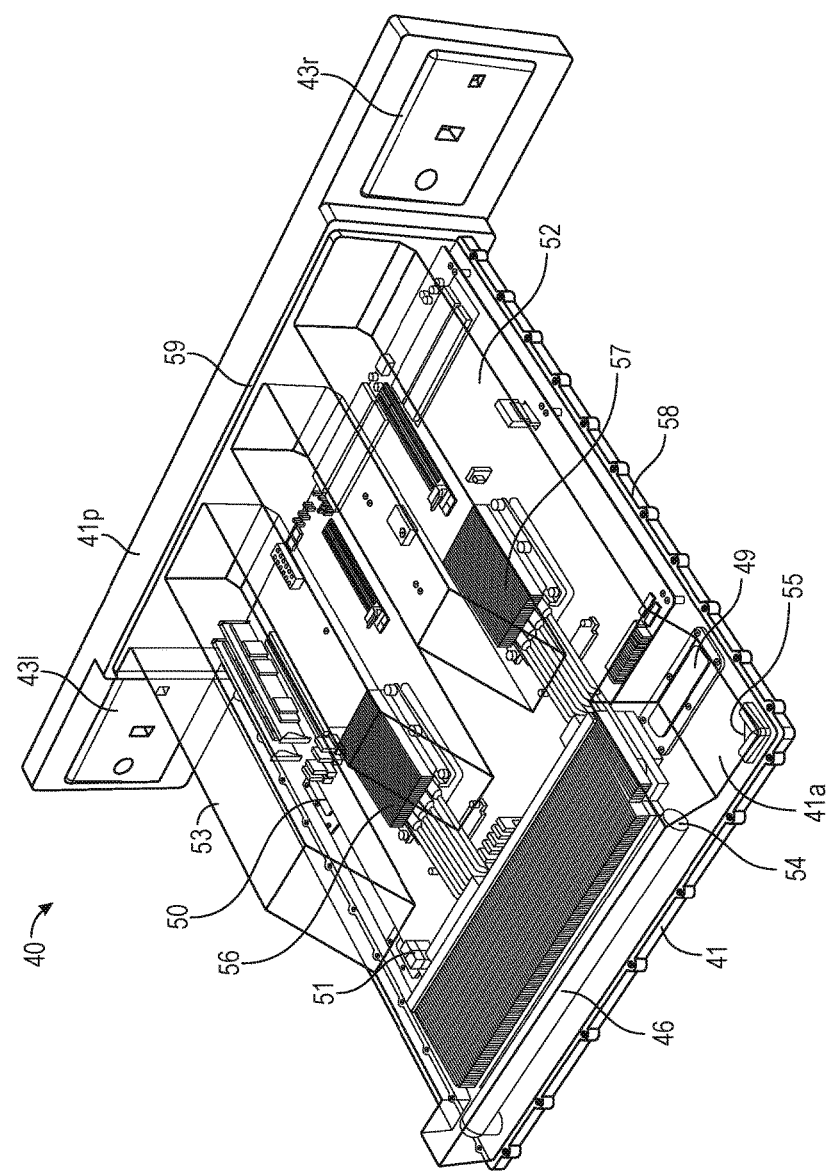
FIG. 6 is a perspective view of an enclosed and immersible portion of an apparatus according to some embodiments.

FIG. 6 illustrates housing 53 attached to support 41 (including support 41p) according to some embodiments. As shown, edges of housing 53 are mated to grooves 58 and 59. Housing 53 may be substantially transparent and its dimensions may be specified so as to provide suitable cooling volume and structural integrity.

Figure 7:
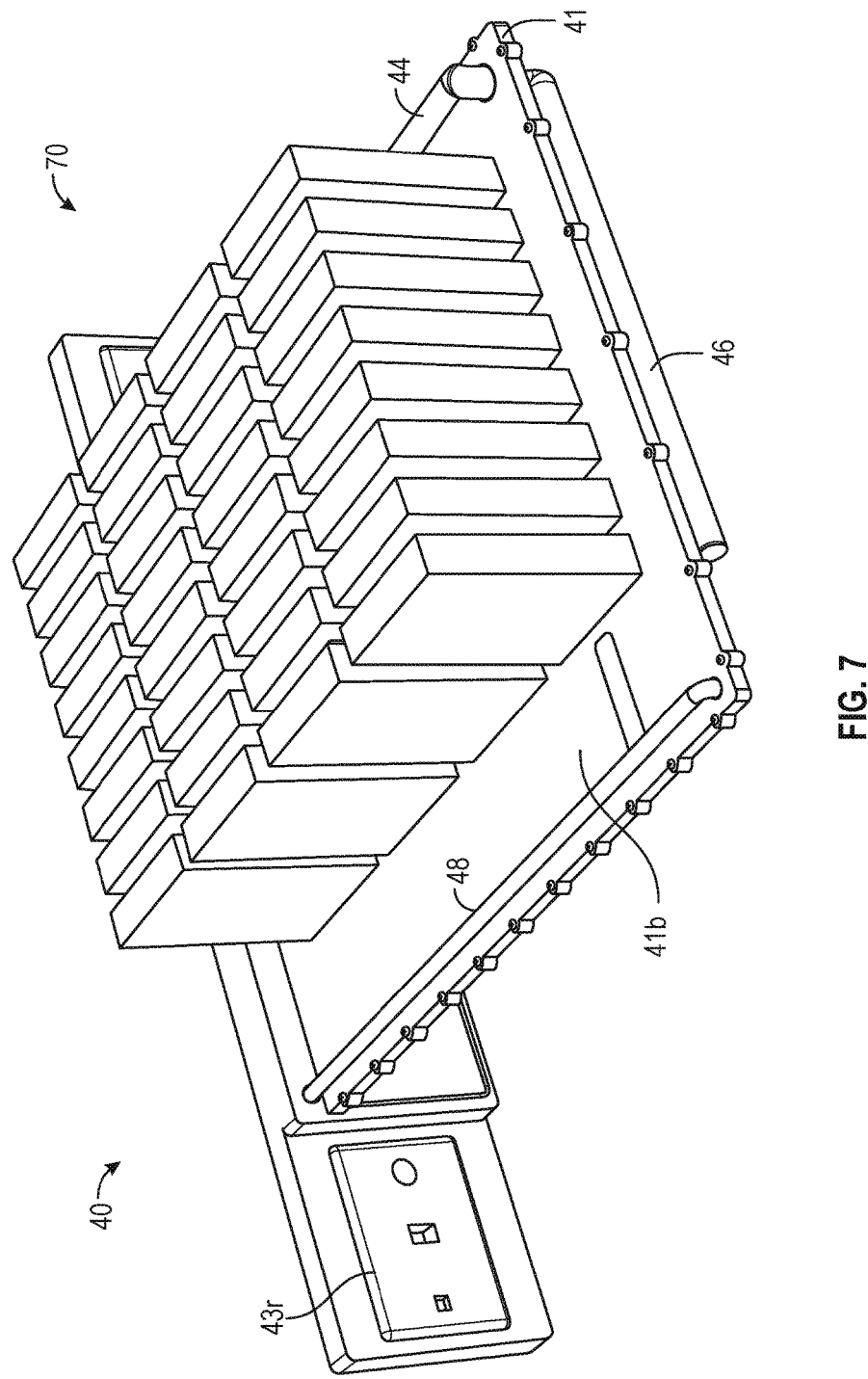
FIG. 7 is a perspective view of a drive-mounting side of an apparatus with hard disk drives mounted thereon according to some embodiments.

FIG. 7 is a perspective view of apparatus 40 showing array 70 of hard disk drives mounted to second side 41b. The drives of array 70 are electrically coupled to the components mounted to side 41a of support 41 via one or more hard disk drive interface connectors mounted within apertures of support 41. In some embodiments, the drives of array 70 are physically and electrically mounted to a mounting member which is in turn mounted physically and electrically to the one or more hard disk drive interface connectors. Fluid-carrying conduits 44, 46 and 48 are mounted so as not to interfere with array 70. Embodiments are not limited to any particular arrangement of hard disk drives and coolant fluid-carrying conduits.

Figure 8:
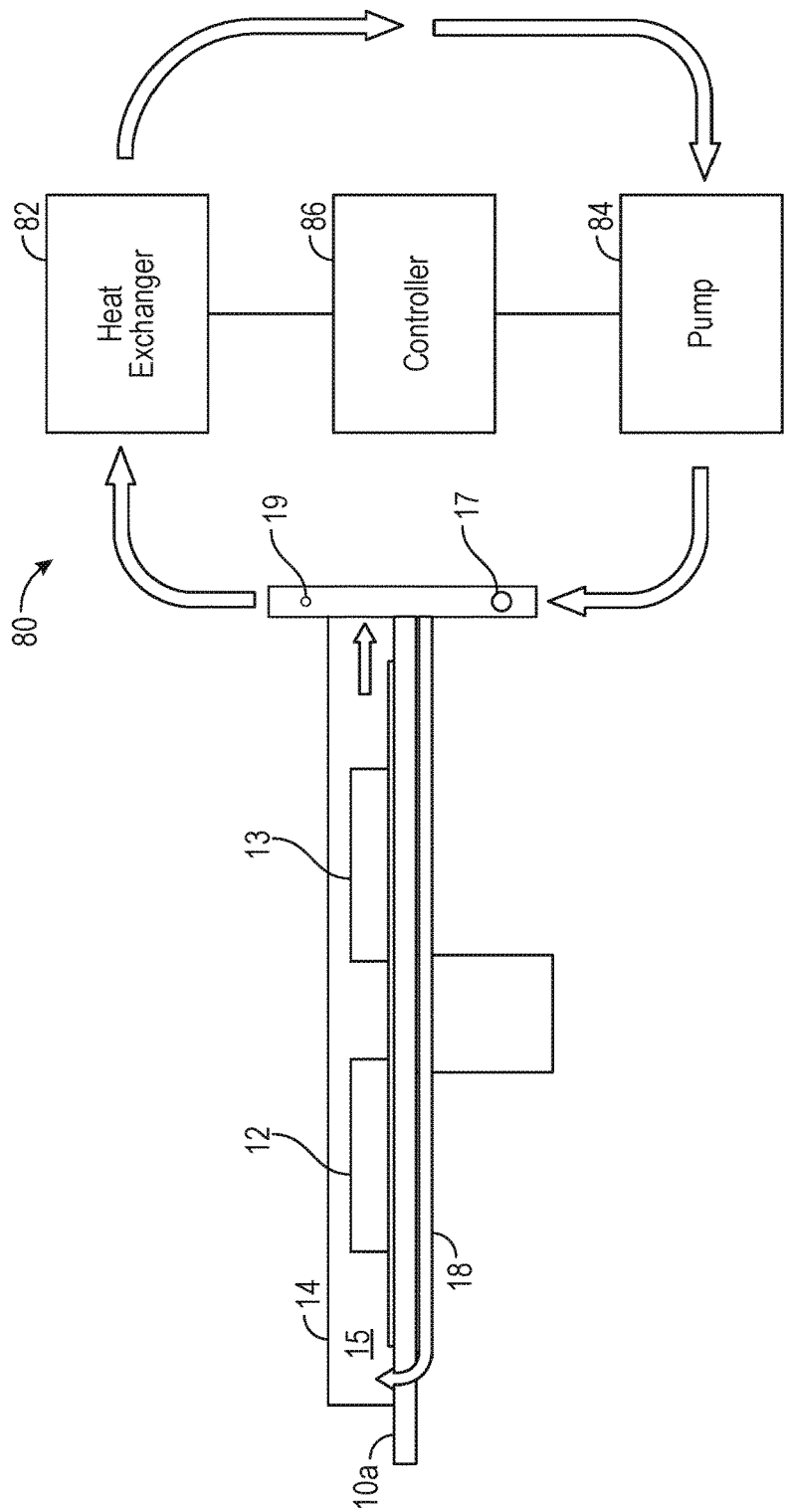
FIG. 8 is a side elevational view of an apparatus and a block diagram of a cooling system according to some embodiments.

FIG. 8 illustrates coolant circulation system 80 according to some embodiments. Coolant circulation system 80 includes pump 82, heat exchanger 84 and controller 86. Coolant circulation system 80 is illustrated in conjunction with apparatus 1 of FIG. 1-3 to explain on example of operation, but embodiments are not limited thereto.

Pump 82 displaces the coolant fluid within the coolant circulation system 80. Pump 82 pumps coolant fluid so that the fluid passes through inlet 17 and conduit 18 into volume 15. The fluid then passes from outlet 19 into heat exchanger 84. Pump 82 can be used to modify the pressure differential within volume 15 of apparatus 1 to ensure that coolant fluid flows from inlet 17 to outlet 19.

Heat exchanger extracts heat from the coolant fluid, which allows the coolant fluid to absorb additional heat when re-circulated through volume 15. Controller 86 may determine and regulate the temperature of the coolant fluid by communicating with and controlling pump 82 and heat exchanger 84. In some embodiments, controller 86 receives temperature and/or pressure measurements from a sensor disposed within volume 15. Controller 86 may transmit control signals to pump 82 and/or heat exchanger 84 based upon the measurements. For example, once the measured temperature exceeds a predetermined temperature threshold, controller 86 controls pump 82 to pump coolant fluid into volume 15

Figure 9:
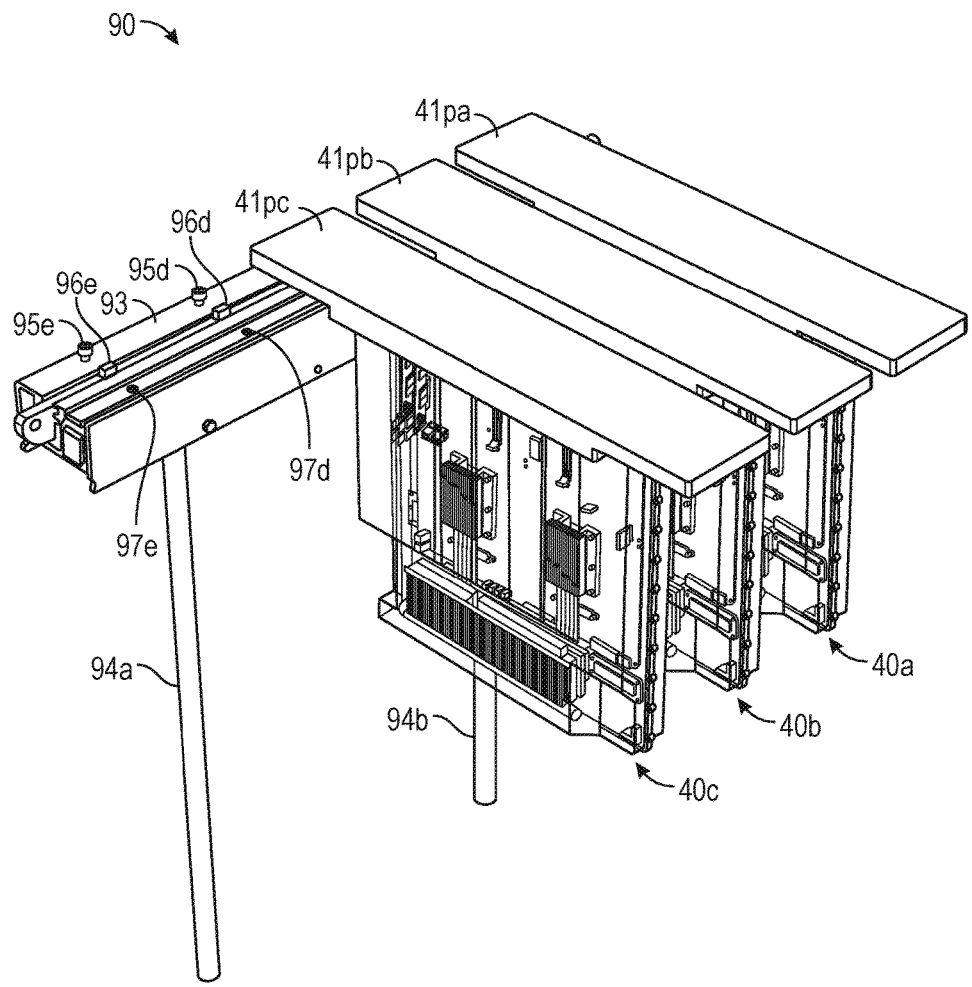
FIG. 9 is a perspective view of an array of apparatus sharing cooling and communication channels according to some embodiments.

FIG. 9 is a perspective view of system 90 according to some embodiments. System 90 includes several instances of apparatus 40 of FIGS. 4-7, labeled 40a, 40b and 40c. System 90 includes rail 93 mounted to vertical supports 94a and 94b. Instances 40a, 40b and 40c are suspended from rail 93 by corresponding portions 41pa, 41pb and 41pc. A second rail parallel to rail 93 and which also supports portions 41pa, 41pb and 41pc, as well as corresponding vertical supports, are omitted from FIG. 9 for clarity.

According to some embodiments, rail 93 includes elements to provide independent and parallel physical, electrical (i.e., power and network) and fluid connections to instances 40a, 40b and 40c. For example, valves 95d and 95e may mate with corresponding apertures 43f of instances of apparatus 40 to provide incoming coolant fluid thereto. Valves 95d and 95e may comprise press-fit lock connectors suitable for hydraulic use. For example, valves 95d and 95e may comprise ball valves which open upon mating with a corresponding aperture 43f and close upon detachment. The above-described unshown parallel rail may provide valves similar to valves 95d and 95e but used to communicate coolant fluid away from corresponding apertures 43c of instances of apparatus 40.

Connectors 96d and 96e may provide a physical connection to apertures 43d of instances of apparatus 40 in order to assist in holding the elements of system 90 stationary. Connectors 97e and 97e, for example, may provide power and network connectivity via corresponding apertures/connectors 43a. Embodiments may employ and suitable one or more connectors to provide power and signal connections.

Figure 10:
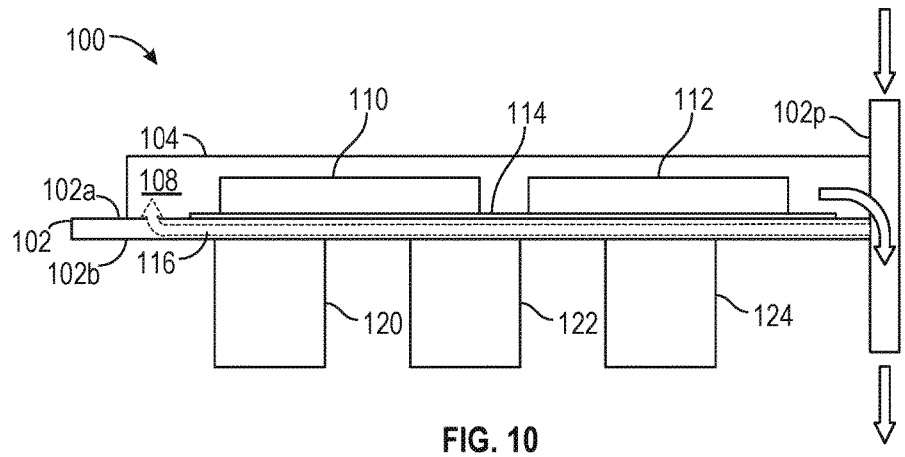
FIG. 10 is a side elevational view of an apparatus according to some embodiments.

FIG. 10 illustrates apparatus 100 according to some embodiments. Apparatus 100 is similar to apparatus 1 of FIGS. 1-3. In this regard, apparatus 100 includes support member 102 including first side 102a and second side 102b, substrate 114 mounted thereon, and components 110 and 112 mounted to substrate 114. Housing 104 is coupled to first side 102a to define leak-resistant volume 108 surrounding components 110 and 112.

Conduit 116 is a passage running at least partially internally within support member 102. In the illustrated embodiment, coolant fluid enters an upper aperture of support member portion 102p and continues through conduit 116 until entering volume 108. Coolant fluid from volume 108 enters an outlet within portion 102p and exits through a lower aperture.

Apparatus 100 includes three hard disk drives 120, 122 and 124 mounted to second side 102b of apparatus 100. Hard disk drives 120, 122 and 124 are coupled to one or more hard disk drive interface connectors exposed on second side 102b. The hard disk drive interface connector(s) may pass through corresponding opening(s) in support member 102 which are sealed to prevent coolant fluid within volume 108 from passing through the opening(s). Accordingly, components within volume 108 may be immersion-cooled while hard disk drives 120, 122 and 124 remain dry.

FIG. 10 illustrates apparatus 100 according to some embodiments. Apparatus 100 is similar to apparatus 1 of FIGS. 1-3. In this regard, apparatus 100 includes support member 102 including first side 102a and second side 102b, substrate 114 mounted thereon, and components 110 and 112 mounted to substrate 114. Housing 104 is coupled to first side 102a, including portion 102p, to define leak-resistant volume 108 surrounding components 110 and 112.

Conduit 116 is a passage running at least partially internally within support member 102. In the illustrated embodiment, coolant fluid enters an upper aperture of support member portion 102p and continues through conduit 116 until entering volume 108. Coolant fluid from volume 108 enters an outlet within portion 102p and exits through a lower aperture.

Apparatus 100 includes three hard disk drives 120, 122 and 124 mounted to second side 102b of apparatus 100. Hard disk drives 120, 122 and 124 are coupled to one or more hard disk drive interface connectors exposed on second side 102b. The hard disk drive interface connector(s) may pass through corresponding opening(s) in support member 102 which are sealed to prevent coolant fluid within volume 108 from passing through the opening(s). Accordingly, components within volume 108 may be immersion-cooled while hard disk drives 120, 122 and 124 remain dry.

Figure 11:
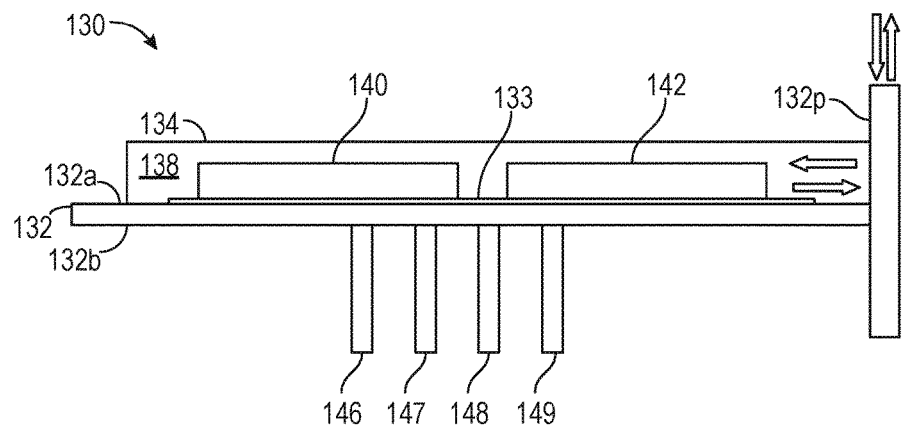
FIG. 11 is a side elevational view of an apparatus according to some embodiments.

FIG. 11 illustrates apparatus 130 according to some embodiments. Apparatus 130 includes support member 132 including first side 132a and second side 132b, substrate 133 mounted thereon, and components 140 and 142 mounted to substrate 133. Housing 134 is coupled to first side 132a, including portion 102p, to define leak-resistant volume 138 surrounding components 140 and 142.

According to apparatus 130, coolant fluid enters a lower aperture of support member portion 132p and then enters volume 138 directly from an inlet aperture within portion 132p. Coolant fluid exits volume 138 via an outlet aperture within portion 102p and through an outlet upper aperture.

Apparatus 130 includes four hard disk drives 146, 147, 148 and 149 mounted to second side 132b of support 132. Hard disk drives 146, 147, 148 and 149 are coupled to one or more hard disk drive interface connectors exposed on second side 132b as described above.

Figure 12:
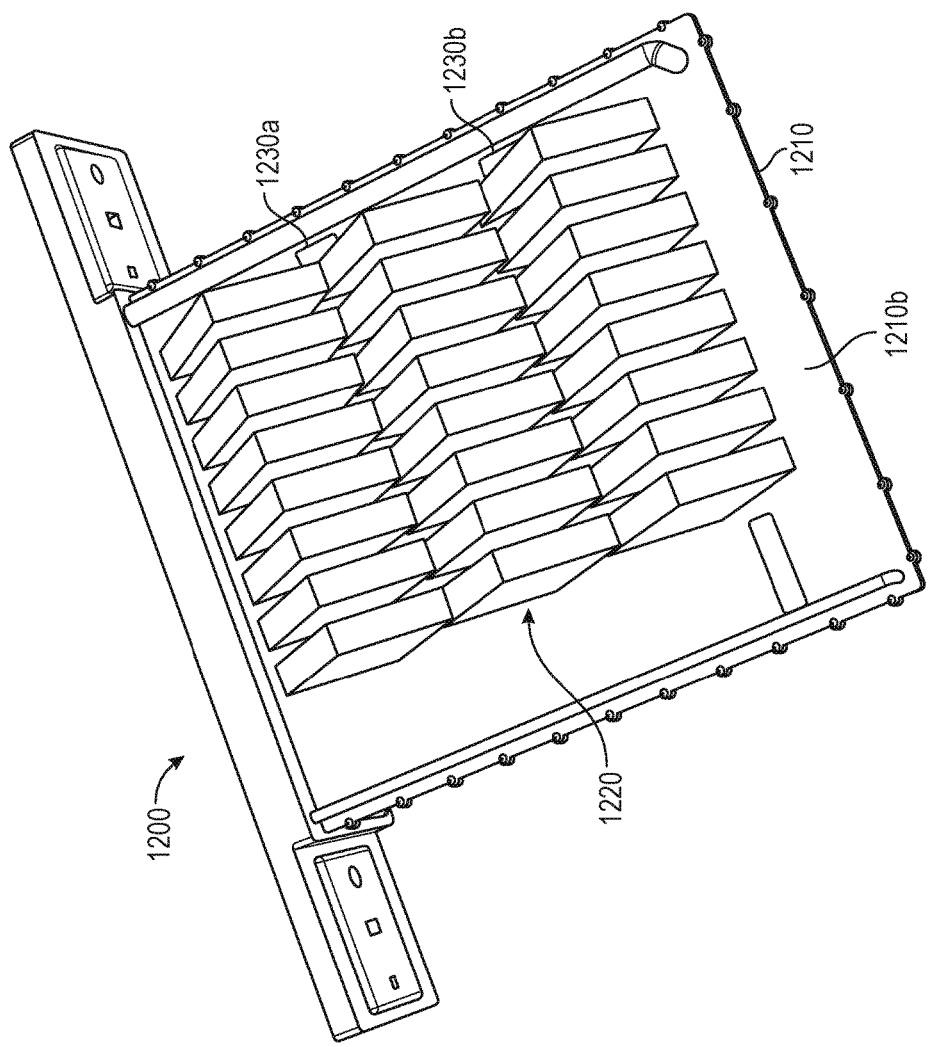
FIG. 12 is a perspective view of a drive-mounting side of an apparatus with hard disk drives mounted thereon according to some embodiments.

FIG. 12 is a perspective view of apparatus 1200 showing array 1220 of hard disk drives mounted to second side 1210b of support member 1210. The drives of array 1220 are electrically coupled to the components mounted on an opposite, unpictured, side of support 1210 via hard disk drive interface connectors 1230a and 1230b. In some embodiments, the drives of array 1220 are physically and electrically mounted to a sawtooth-type mounting member which is in turn mounted physically and electrically to the one or more hard disk drive interface connectors 1230a and 1230b. Such a mounting member may allow use of a greater number of hard disk drives having a lower vertical profile then might otherwise be available.

Figure 13:
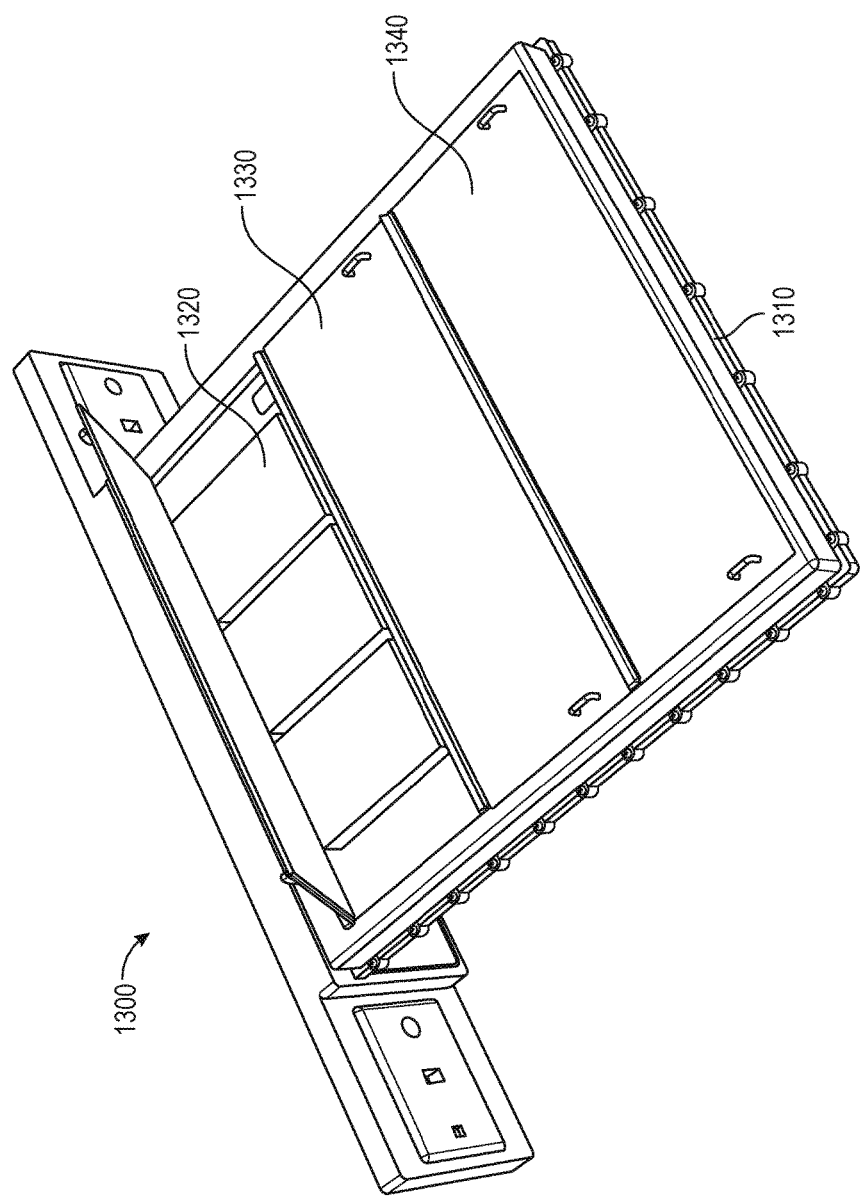
FIG. 13 is a perspective view of a drive-mounting side of an apparatus with hard disk drives mounted thereon according to some embodiments.

FIG. 13 is a perspective view of apparatus 1300 showing disk cabinets 1320, 1330 and 1340 mounted to support member 1310 according to some embodiments. Each cabinet may include hard disk drives which are electrically coupled to components mounted on an opposite side of support 1310 and which are immersion-cooled as described herein. Disk cabinets 1320, 1330 and 1340 may provide a low overall profile to apparatus 1300, and facilitate hot swapping, physical mounting of disk drives to support member 1310, and electrical connection of disk drives to hard disk drive interface connectors which are exposed on support member 1310.

The foregoing diagrams represent examples of physical architectures for describing some embodiments, and actual implementations may include more or different components arranged in other manners. Moreover, each physical element, component or device described herein may be implemented by any physical elements, component or devices.

Embodiments described herein are solely for the purpose of illustration. Those in the art will recognize other embodiments may be practiced with modifications and alterations to that described above.

What is claimed is:

1. An apparatus comprising:
   a support member;
   a hard disk drive interface connector, a first side of the hard disk drive interface connector disposed on a first side of the support member and a second side of the hard disk drive interface connector disposed on a second side of the support member;
   a conduit coupled to the support member, the conduit coupled to a fluid inlet disposed on the first side of the support member;
   a fluid outlet disposed on the first side of the support member; and
   a housing coupled to the first side of the support member and defining a volume with the support member,
   wherein an interface between the housing and the first side of the support member is leak-resistant, and wherein the fluid inlet and fluid outlet are in fluid communication with the volume.

2. An apparatus according to claim 1, further comprising:
   a substrate coupled to the first side of the support member and to the first side of the hard drive interface connector; and
   at least one heat-generating device coupled to the substrate and disposed within the volume.

3. An apparatus according to claim 2, wherein the substrate comprises a printed circuit board and at least one heat-generating device comprises an integrated circuit.

4. An apparatus according to claim 3, further comprising at least one hard disk drive coupled to the second side of the support member and to the second side of the hard disk drive interface connector.

5. An apparatus according to claim 1, further comprising at least one hard disk drive coupled to the second side of the support member and to the second side of the hard disk drive interface connector.

6. An apparatus according to claim 5, further comprising a hard disk drive mounting member coupled to the second side of the support member and to the second side of the hard disk drive interface connector, the at least one hard disk drive coupled to the hard disk drive mounting member.

7. An apparatus according to claim 1, wherein the conduit is coupled to the second side of the support member.

8. An apparatus according to claim 1, wherein the conduit is a passage integrated within the support member.

9. An apparatus according to claim 1, the support member comprising a first portion and a second portion, a first side of the first portion being substantially perpendicular to a first side of the second portion, the housing coupled to the first side of the first portion and to the first side of the second portion, and the volume defined by the first side of the first portion, the second side of the second portion, and the housing.

10. An apparatus according to claim 9, the second portion comprising an incoming conduit in fluid communication with the volume, and an outgoing conduit in fluid communication with the volume, a first flow valve connection coupled to the incoming conduit and a second flow valve connector coupled to the outgoing conduit.

11. An apparatus comprising:
a support member;
a printed circuit board coupled to a first side of the support member;
at least one integrated circuit coupled to the printed circuit board;
at least one hard disk drive coupled to a second side of the support member; and
a housing coupled to the first side of the support member and defining a volume with the support member, where the at least one integrated circuit is disposed within the volume and the at least one hard disk drive is not disposed within the volume.

12. An apparatus according to claim 11, further comprising:
coolant fluid disposed within the volume.

13. An apparatus according to claim 12, further comprising:
a hard drive interface connector, a first side of the hard drive interface connector disposed on the first side of the support member and a second side of the hard drive interface connector disposed on the second side of the support member; and
a hard disk drive mounting member coupled to the second side of the support member and to the second side of the hard drive interface connector, the at least one hard disk drive coupled to the hard disk drive mounting member.

14. An apparatus according to claim 13, the support member comprising a first portion and a second portion, a first side of the first portion being substantially perpendicular to a first side of the second portion, the housing coupled to the first side of the first portion and to the first side of the second portion, and the volume defined by the first side of the first portion, the second side of the second portion, and the housing.

15. An apparatus according to claim 14, the second portion comprising an incoming conduit in fluid communication with the volume, and an outgoing conduit in fluid communication with the volume, a first flow valve connection coupled to the incoming conduit and a second flow valve connector coupled to the outgoing conduit.

16. An apparatus comprising:
a support member;
a housing coupled to a first side of the support member and defining a volume with the support member;
a conduit coupled to the support member, the conduit coupled to a fluid inlet disposed on the first side of the support member;
a fluid outlet disposed on the first side of the support member; and
at least one hard disk drive coupled to a second side of the support member;
wherein an interface between the housing and the first side of the support member is leak-resistant, wherein the fluid inlet and fluid outlet are in fluid communication with the volume, and wherein the at least one hard disk drive is not disposed within the volume.

17. An apparatus according to claim 16, further comprising:
a printed circuit board coupled to the first side of the support member; and
at least one integrated circuit coupled to the substrate and disposed within the volume.

18. An apparatus according to claim 16, wherein the conduit is a passage integrated within the support member.

19. An apparatus according to claim 16, the support member comprising a first portion and a second portion, a first side of the first portion being substantially perpendicular to a first side of the second portion, the housing coupled to the first side of the first portion and to the first side of the second portion, and the volume defined by the first side of the first portion, the second side of the second portion, and the housing.

20. An apparatus according to claim 19, the second portion comprising an incoming conduit in fluid communication with the volume, and an outgoing conduit in fluid communication with the volume, a first flow valve connection coupled to the incoming conduit and a second flow valve connector coupled to the outgoing conduit.

* * * * *